United States Patent
Yeo (10) Patent No.: US 9,923,014 B2
(45) Date of Patent: Mar. 20, 2018

(54) IMAGE SENSOR AND METHOD OF MANUFACTURING THE SAME

(71) Applicant: DONGBU HITEK CO., LTD., Seoul (KR)

(72) Inventor: In Guen Yeo, Chungcheongbuk-do (KR)

(73) Assignee: DB HITEK CO., LTD., Seoul (KR)

( * ) Notice: Subject to any disclaimer, the term of this patent is extended or adjusted under 35 U.S.C. 154(b) by 0 days.

(21) Appl. No.: 15/372,599

(22) Filed: Dec. 8, 2016

(65) Prior Publication Data

US 2017/0170228 A1 Jun. 15, 2017

(30) Foreign Application Priority Data

Dec. 10, 2015 (KR) .................. 10-2015-0175814

(51) Int. Cl.
*H01L 27/146* (2006.01)
(52) U.S. Cl.
CPC .... *H01L 27/14643* (2013.01); *H01L 27/1461* (2013.01); *H01L 27/14607* (2013.01); *H01L 27/14614* (2013.01); *H01L 27/14689* (2013.01)
(58) Field of Classification Search
CPC ........... H01L 27/14641; H01L 27/1461; H01L 27/14614; H01L 27/14607; H01L 27/14689
See application file for complete search history.

(56) References Cited

U.S. PATENT DOCUMENTS

| | | | | |
|---|---|---|---|---|
| 6,026,964 A | * | 2/2000 | Hook | ................ H01L 27/14609 257/236 |
| 7,154,137 B2 | * | 12/2006 | Nozaki | ............ H01L 27/14632 257/233 |
| 2013/0140663 A1 | * | 6/2013 | Fukuda | .................. G03B 13/36 257/432 |

FOREIGN PATENT DOCUMENTS

KR 1020130013701 A 2/2013

* cited by examiner

*Primary Examiner* — Peniel M Gumedzoe
(74) *Attorney, Agent, or Firm* — Patterson Thuente Pedersen, P.A.

(57) ABSTRACT

An image sensor includes a first charge storage region of a first conductive type disposed in a substrate, a second charge storage region of a second conductive type disposed on one side of the first charge storage region, a first floating diffusion region spaced apart from the first charge storage region, a second floating diffusion region spaced apart from the second charge storage region, a first transfer gate disposed on the substrate between the first charge storage region and the first floating diffusion region, and a second transfer gate disposed on the substrate between the second charge storage region and the second floating diffusion region.

15 Claims, 6 Drawing Sheets

IMAGE SENSOR AND METHOD OF MANUFACTURING THE SAME

CROSS-REFERENCE TO RELATED APPLICATION

This application claims the priority benefit of Korean Patent Application No. 10-2015-0175814, filed on Dec. 10, 2015, and all the benefits accruing therefrom under 35 U.S.C. § 119, the contents of which are incorporated by reference in their entirety.

BACKGROUND

The present disclosure relates to an image sensor and a method of manufacturing the same. In more detail, the present disclosure relates to a complementary metal-oxide-semiconductor (CMOS) image sensor having an improved sensitivity and a method of manufacturing the same.

In general, an image sensor is a semiconductor device that converts an optical image into electrical signals, and may be classified or categorized as a charge coupled device (CCD) or a CMOS image sensor (CIS).

The CMOS image sensor includes unit pixels, each including a photodiode and MOS transistors. The CMOS image sensor sequentially detects the electrical signals of the unit pixels using a switching method, thereby forming an image.

The CMOS image sensor is made by forming photodiodes in or on a semiconductor substrate, forming transistors connected to the photodiodes on the semiconductor substrate, forming wiring layers functioning as signal lines connected to the transistors, and forming a color filter layer and micro lenses on or over the wiring layers.

Especially, the CMOS image sensor includes a plurality of pixel regions arranged in rows and columns, and a photodiode, a transfer gate, a floating diffusion region, etc. are formed in or on each pixel region. For example, the photodiode includes a p-type surface layer and an n-type storage region, and when incident light strikes the surface of the photodiode, electrons (charge carriers) are generated in the depletion region of the p-n junction of the photodiode. The electrons are accumulated in the n-type storage region, and then moved to the floating diffusion region through the transfer gate.

The sensitivity of the image sensor may be determined by the quantity of electric charge accumulated in the photodiode. However, as the degree of integration of the image sensor is increased, the size of the photodiode is decreased, and the sensitivity of the image sensor may thus be deteriorated.

SUMMARY

The present disclosure provides an image sensor having an improved sensitivity and a method of manufacturing the same.

In accordance with an aspect of the present disclosure, an image sensor may include a first charge storage region of a first conductive type disposed in a substrate, a second charge storage region of a second conductive type disposed on one side of the first charge storage region, a first floating diffusion region spaced apart from the first charge storage region, a second floating diffusion region spaced apart from the second charge storage region, a first transfer gate disposed on the substrate between the first charge storage region and the first floating diffusion region, and a second transfer gate disposed on the substrate between the second charge storage region and the second floating diffusion region.

In accordance with some exemplary embodiments of the present disclosure, the image sensor may further include a first pinning layer of the first conductive type disposed on the first and second charge storage regions and a second pinning layer of the second conductive type disposed on the first pinning layer, such that the first pinning layer may electrically isolate the second charge storage region from the second pinning layer.

In accordance with some exemplary embodiments of the present disclosure, the image sensor may further include a third charge storage region of the first conductive type disposed in the substrate. In such case, the first and second charge storage regions may be disposed on the third charge storage region.

In accordance with some exemplary embodiments of the present disclosure, the image sensor may further include a pinning layer of the second conductive type disposed on the first and second charge storage regions. In such case, the first charge storage region may have an upper extending portion disposed between the second charge storage region and the pinning layer to electrically isolate the second charge storage region from the pinning layer.

In accordance with some exemplary embodiments of the present disclosure, the first charge storage region may have a lower extending portion disposed between the second charge storage region and the substrate to electrically isolate the second charge storage region from the substrate.

In accordance with some exemplary embodiments of the present disclosure, the image sensor may further include a well region of the first conductive type disposed on one side of the second charge storage region. In such case, the second floating diffusion region and the second transfer gate may be disposed on the well region.

In accordance with some exemplary embodiments of the present disclosure, the image sensor may further include a well region of the second conductive type disposed on another side of the first charge storage region. In such case, the first floating diffusion region and the first transfer gate may be disposed on the well region.

In accordance with some exemplary embodiments of the present disclosure, the second charge storage region may have a plurality of extending portions which extends to an inside of the first charge storage region to increase a surface area of the interconnection of the first charge storage region and the second charge storage region.

In accordance with another aspect of the present disclosure, an image sensor may include a first charge storage region of a first conductive type disposed in a substrate, a second charge storage region of a second conductive type disposed in the first charge storage region and laterally exposed through one side of the first charge storage region, a first floating diffusion region spaced apart from the first charge storage region, a second floating diffusion region spaced apart from the second charge storage region, a first transfer gate disposed on the substrate between the first charge storage region and the first floating diffusion region, and a second transfer gate disposed on the substrate between the second charge storage region and the second floating diffusion region.

In accordance with some exemplary embodiments of the present disclosure, the image sensor may further include a pinning layer of the second conductive type disposed on the first charge storage region.

In accordance with some exemplary embodiments of the present disclosure, the image sensor may further include a well region of the first conductive type disposed on one side of the second charge storage region. In such case, the second floating diffusion region and the second transfer gate may be disposed on the well region.

In accordance with some exemplary embodiments of the present disclosure, the image sensor may further include a well region of the second conductive type disposed on another side of the first charge storage region. In such case, the first floating diffusion region and the first transfer gate may be disposed on the well region.

In accordance with still another aspect of the present disclosure, a method of manufacturing an image sensor may include forming a first transfer gate and a second transfer gate spaced apart from each other on a substrate, forming a first charge storage region of a first conductive type in the substrate between the first and second transfer gates, forming a second charge storage region of a second conductive type in the substrate between the first and second transfer gates, the second charge storage region being disposed on one side of the first charge storage region, forming a first floating diffusion region in the substrate, the first floating diffusion region being spaced apart from the first charge storage region, and the first transfer gate being disposed on the substrate between the first charge storage region and the first floating diffusion region, and forming a second floating diffusion region in the substrate, the second floating diffusion region being spaced apart from the second charge storage region, and the second transfer gate being disposed on the substrate between the second charge storage region and the second floating diffusion region.

In accordance with some exemplary embodiments of the present disclosure, the method may further include forming a first pinning layer of the first conductive type on the first and second charge storage regions and forming a second pinning layer of the second conductive type on the first pinning layer.

In accordance with some exemplary embodiments of the present disclosure, the method may further include forming a third charge storage region of the first conductive type in the substrate. In such case, the first and second charge storage regions may be formed on the third charge storage region.

In accordance with some exemplary embodiments of the present disclosure, the method may further include forming a well region of the first conductive type in the substrate. In such case, the second floating diffusion region and the second transfer gate may be formed on the well region.

In accordance with some exemplary embodiments of the present disclosure, the method may further include forming a well region of the second conductive type in the substrate. In such case, the first floating diffusion region and the first transfer gate may be formed on the well region.

In accordance with some exemplary embodiments of the present disclosure, the second charge storage region may have a plurality of extending portions which extends to an inside of the first charge storage region to increase a surface area of the interconnection of the first charge storage region and the second charge storage region.

In accordance with still another aspect of the present disclosure, a method of manufacturing an image sensor may include forming a first transfer gate and a second transfer gate spaced apart from each other on a substrate, forming a first charge storage region of a first conductive type in the substrate between the first and second transfer gates, forming a second charge storage region of a second conductive type in the first charge storage region, the second charge storage region being laterally exposed through one side of the first charge storage region, forming a first floating diffusion region in the substrate, the first floating diffusion region being spaced apart from the first charge storage region, and the first transfer gate being disposed on the substrate between the first charge storage region and the first floating diffusion region, and forming a second floating diffusion region in the substrate, the second floating diffusion region being spaced apart from the second charge storage region, and the second transfer gate being disposed on the substrate between the second charge storage region and the second floating diffusion region.

In accordance with some exemplary embodiments of the present disclosure, the method may further include forming a pinning layer of the second conductive type on the first charge storage region.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Exemplary embodiments can be understood in more detail from the following description taken in conjunction with the accompanying drawings, in which.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF THE DRAWINGS

Hereinafter, embodiments are described in more detail with reference to the accompanying drawings. However, the present invention is not limited to the embodiments described below and is implemented in various other forms. Embodiments below are not provided to fully complete the present invention but rather are provided to fully convey the range of the present invention and the claims to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention or the claimed embodiments thereof.

Figure 1:
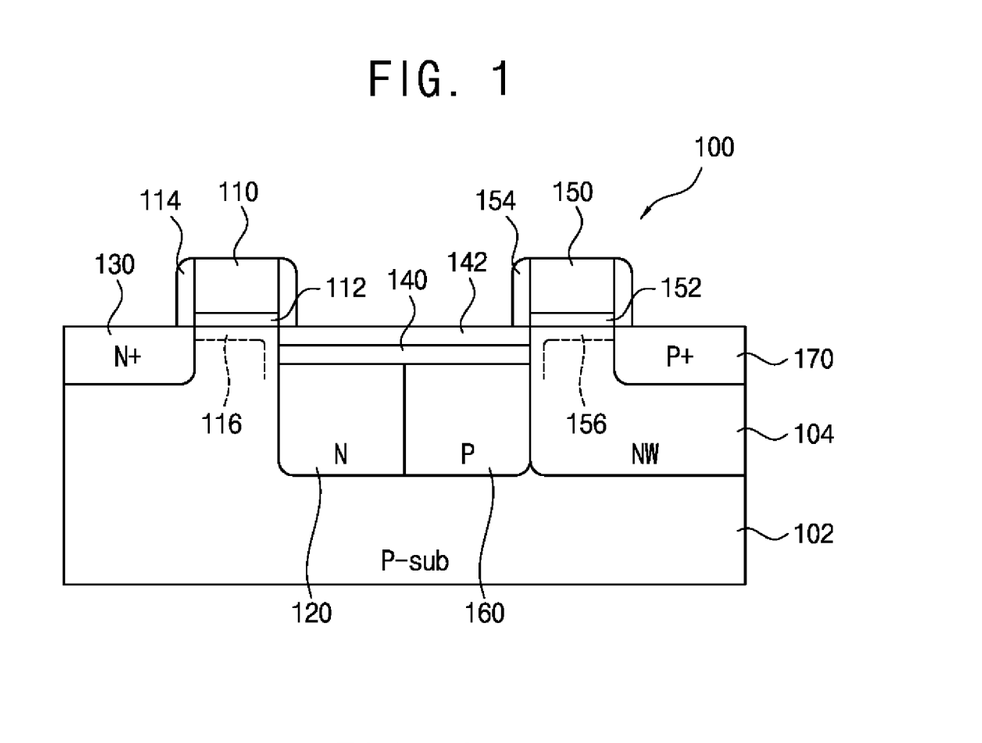
FIG. 1 is a cross-sectional view illustrating an image sensor in accordance with an embodiment.
Figure 2:
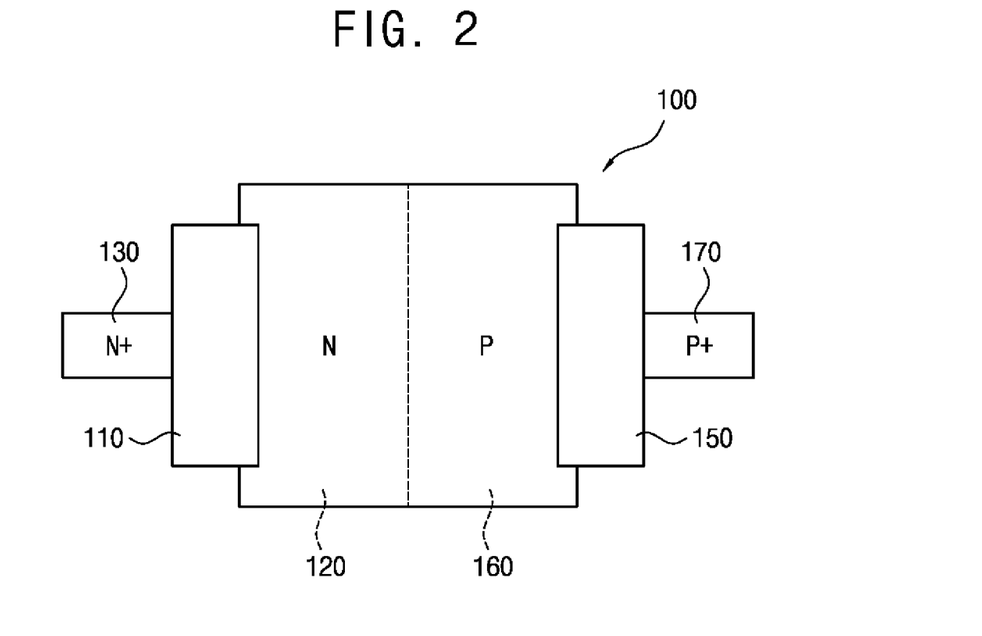
FIG. 2 is a plan view illustrating the image sensor of FIG. 1.

FIG. 1 is a cross-sectional view illustrating an image sensor in accordance with an exemplary embodiment of the present invention, and FIG. 2 is a plan view illustrating the image sensor as shown in FIG. 1.

Referring to FIGS. 1 and 2, in accordance with an exemplary embodiment of the present invention, an image sensor 100 may include a first charge storage region 120 and a second charge storage region 160 disposed in a substrate 102. The first charge storage region 120 may have a first conductive type, and the second charge storage region 160 may have a second conductive type and may be disposed on one side of the first charge storage region 120.

For example, the first charge storage region 120 may be an n-type impurity region, and the second charge storage region 160 may be a p-type impurity region, as indicated in FIGS. 1 and 2 by the labels "N" and "P," respectively. Alternatively, in other embodiments, the first charge storage region 120 may be a p-type impurity region, and the second charge storage region 160 may be an n-type impurity region. Further, a p-type substrate may be used as the substrate 102. Alternatively, a p-type epitaxial layer may be formed on the substrate 102, as indicated by the label "P-sub." In such case, the first and second charge storage regions 120 and 160 may be formed in the p-type epitaxial layer.

The first and second charge storage regions 120 and 160 may be used as a photodiode of the image sensor 100. The second charge storage region 160 may be disposed on one side of the first charge storage region 120, and a p-n junction may thus be formed between the first and second charge storage regions 120 and 160 at their interface.

The image sensor 100 may include a first transfer gate 110 and a second transfer gate 150 formed on the substrate 102. The first transfer gate 110 may be disposed adjacent to (or in electrical communication with, as described below) the first charge storage region 120, and the second transfer gate 150 may be disposed adjacent to (or in electrical communication with, as described below) the second charge storage region 160. Further, the image sensor 100 may include a first floating diffusion region 130 spaced apart from the first charge storage region 120 opposite first transfer gate 110, and a second floating diffusion region 170 spaced apart from the second charge storage region 160 opposite second transfer gate 150, as shown in FIG. 2.

The first transfer gate 110 may be disposed on the substrate 102 between the first charge storage region 120 and the first floating diffusion region 130 such that a first channel region 116 may be formed between the first charge storage region 120 and the first floating diffusion region 130. The second transfer gate 150 may be disposed on the substrate 102 between the second storage region 160 and the second floating diffusion region 170 such that a second channel region 156 may be formed between the second storage region 160 and the second floating diffusion region 170. For example, the first floating diffusion region 130 may be a high concentration n-type impurity diffusion region, and the second floating diffusion region 170 may be a high concentration p-type impurity diffusion region.

A first gate insulating layer 112 may be disposed between the first transfer gate 110 and the substrate 102, and first spacers 114 may be disposed on side surfaces of the first transfer gate 110. Further, a second gate insulating layer 152 may be disposed between the second transfer gate 150 and the substrate 102, and second spacers 154 may be disposed on side surfaces of the second transfer gate 150.

A first pinning layer 140 of the first conductive type may be disposed on the first and second charge storage regions 120 and 160, and a second pinning layer 142 of the second conductive type may be disposed on the first pinning layer 140. The first pinning layer 140 may be used so as to isolate the second charge storage region 160 from the second pinning layer 142 and may be simultaneously formed with the first charge storage region 120, in embodiments. For example, the first pinning layer 140 may be an n-type impurity layer, and the second pinning layer 142 may be a p-type impurity layer.

A first well region 104 of the first conductive type may be disposed on one side of the second charge storage region 160, and the second transfer gate 150 and the second floating diffusion region 170 may be disposed on the first well region 104. The first well region 104 may be used to prevent charge carriers from moving from the second charge storage region 160 to the second floating diffusion region 170 in an off-state of the second transfer gate 150 (i.e., when second transfer gate 150 is not biased). For example, the first well region 104 may be a low concentration n-type impurity region in the depicted embodiment, as indicated by the label "NW."

In accordance with an exemplary embodiment of the present invention as described above, electrons and holes generated in the photodiode by the incident photons may be accumulated in the first and second charge storage regions 120 and 160 by the inner potential of the photodiode, respectively. The electrons and holes may be moved to the first and second floating diffusion regions 130 and 170 through the first and second channels 116 and 156 under the first and second transfer gates 110 and 150, respectively.

An output signal value of the image sensor 100 may be determined by a difference value between a first output voltage from the first floating diffusion region 130 and a second output voltage from the second floating diffusion region 170. Thus, the sensitivity of the image sensor 100 may be significantly improved in comparison with the conventional art in which the sensitivity is determined by the incident photon-to-electron current conversion efficiency or the incident photon-to-hole current conversion efficiency. Further, the dynamic range of the image sensor 100 may be significantly improved as well.

Figure 3:
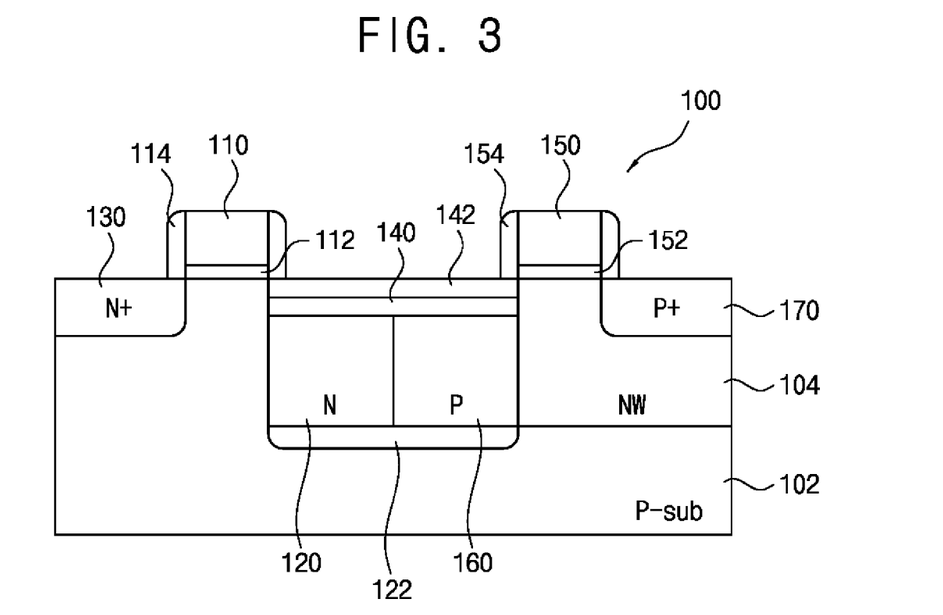
FIG. 3 is a cross-sectional view illustrating an image sensor in accordance with an embodiment.
Figure 4:
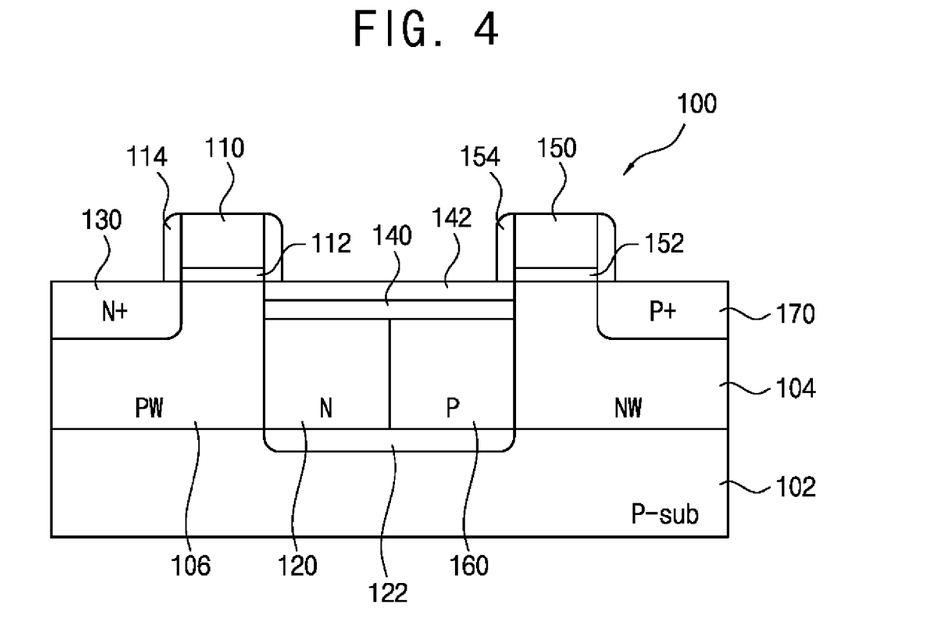
FIG. 4 is a cross-sectional view illustrating an image sensor in accordance with an embodiment.

FIG. 3 is a cross-sectional view illustrating an image sensor in accordance with another exemplary embodiment of the present invention, and FIG. 4 is a cross-sectional view illustrating an image sensor in accordance with still another exemplary embodiment of the present invention.

Referring to FIG. 3, in accordance with another exemplary embodiment of the present invention, the image sensor 100 may further include a third charge storage region 122 of the first conductive type. In such case, the first and second charge storage regions 120 and 160 may be disposed on the third charge storage region 122. Particularly, the third charge storage region 122 may be used to isolate the second charge storage region 160 from the substrate 102. For example, the third charge storage region 122 may be an n-type impurity region and may be simultaneously formed with the first charge storage region 120.

Referring to FIG. 4, in accordance with still another exemplary embodiment of the present invention, a second well region 106 of the second conductive type may be disposed on another side of the first charge storage region 120, and the first transfer gate 110 and the first floating diffusion region 130 may be disposed on the second well region 106. For example, the second well region 106 may be a low concentration p-type impurity region.

Figure 5:
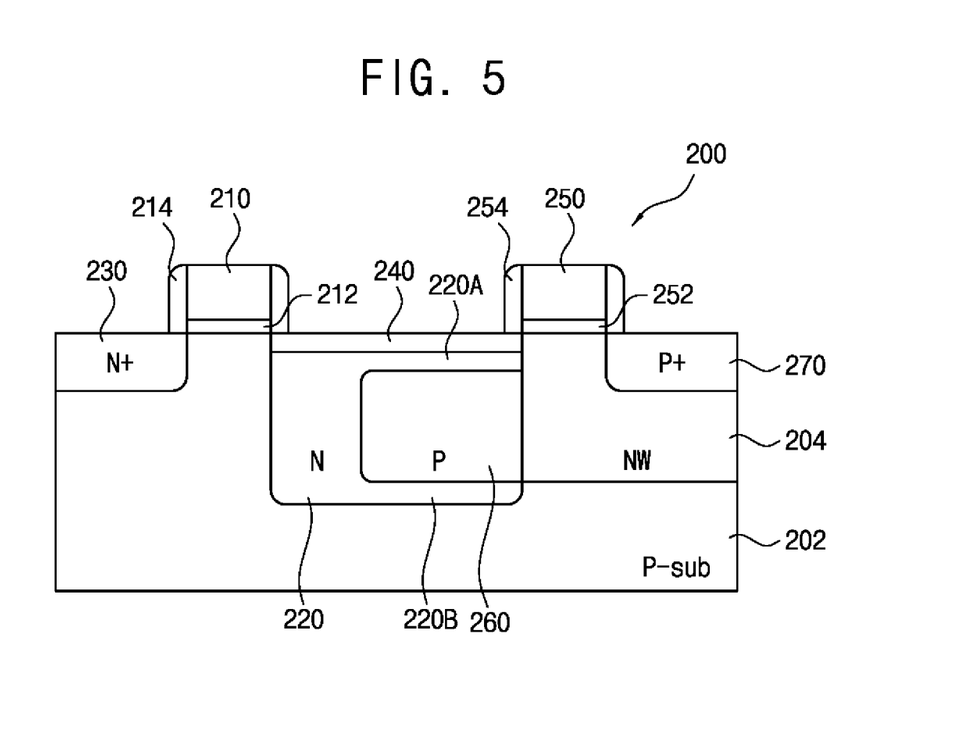
FIG. 5 is a cross-sectional view illustrating an image sensor in accordance with still an embodiment.
Figure 6:
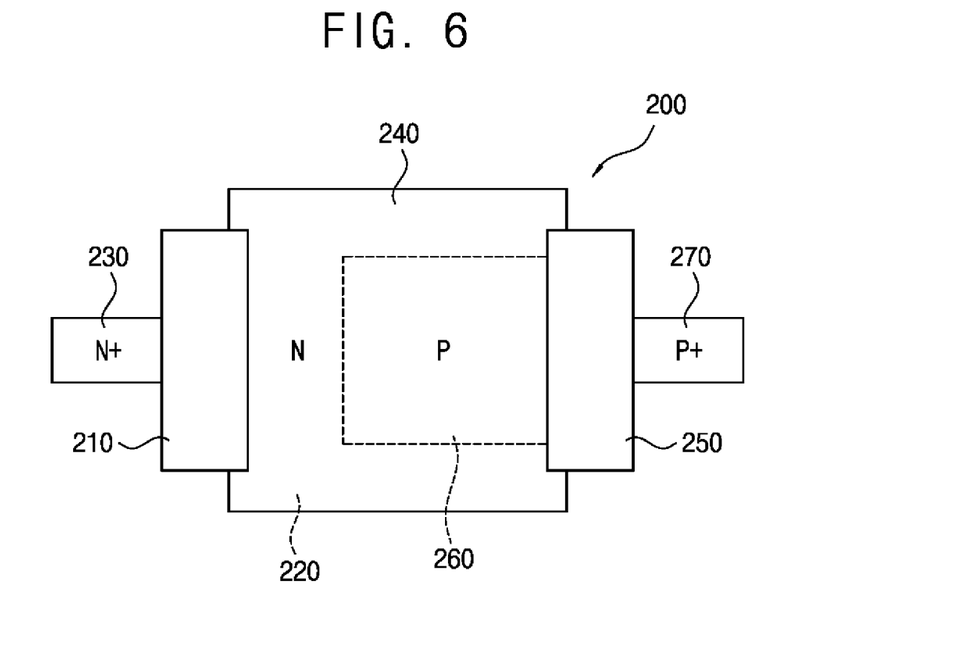
FIG. 6 is a plan view illustrating the image sensor of FIG. 5.

FIG. 5 is a cross-sectional view illustrating an image sensor in accordance with still another exemplary embodiment of the present invention, and FIG. 6 is a plan view illustrating the image sensor as shown in FIG. 5.

Referring to FIGS. 5 and 6, in accordance with still another exemplary embodiment of the present invention, an image sensor 200 may include a first charge storage region 220 and a second charge storage region 260 in a substrate 202, a first transfer gate 210 and a second transfer gate 250 on the substrate 202, a first floating diffusion region 230 spaced apart from the first charge storage region 220 and a second floating diffusion region 270 spaced apart from the second charge storage region 260.

The first charge storage region 220 may have a first conductive type, and the second charge storage region 260 may have a second conductive type. Particularly, the second charge storage region 260 may be disposed in the first charge storage region 220 and may be laterally exposed through one side of the first charge storage region 220.

A first well region 204 of the first conductive type may be disposed on the exposed one side of the second charge storage region 260, and a p-n junction may thus be formed between the first well region 204 and the exposed one side of the second charge storage region 260 at their interface. The second transfer gate 250 and the second floating diffusion region 270 may be disposed on the first well region 204. Alternatively, though not shown in figures, a second well region (not shown) of the second conductive type may be disposed on another side of the first charge storage region 220, and the first transfer gate 210 and the first floating diffusion region 230 may be disposed on the second well region.

A pinning layer 240 of the second conductive type may be disposed on the first charge storage region 220. Particularly, the first charge storage region 220 may have an upper extending portion 220A disposed between the second charge storage region 260 and the pinning layer 240 so as to isolate the second charge storage region 260 from the pinning layer 240. Further, the first charge storage region 220 may have a lower extending portion 220B disposed between the second charge storage region 260 and the substrate 202 so as to isolate the second charge storage region 260 from the substrate 202.

A first gate insulating layer 212 may be disposed between the first transfer gate 210 and the substrate 202, and first spacers 214 may be disposed on side surfaces of the first transfer gate 210. Further, a second gate insulating layer 252 may be disposed between the second transfer gate 250 and the substrate 202, and second spacers 254 may be disposed on side surfaces of the second transfer gate 250.

Figure 7:
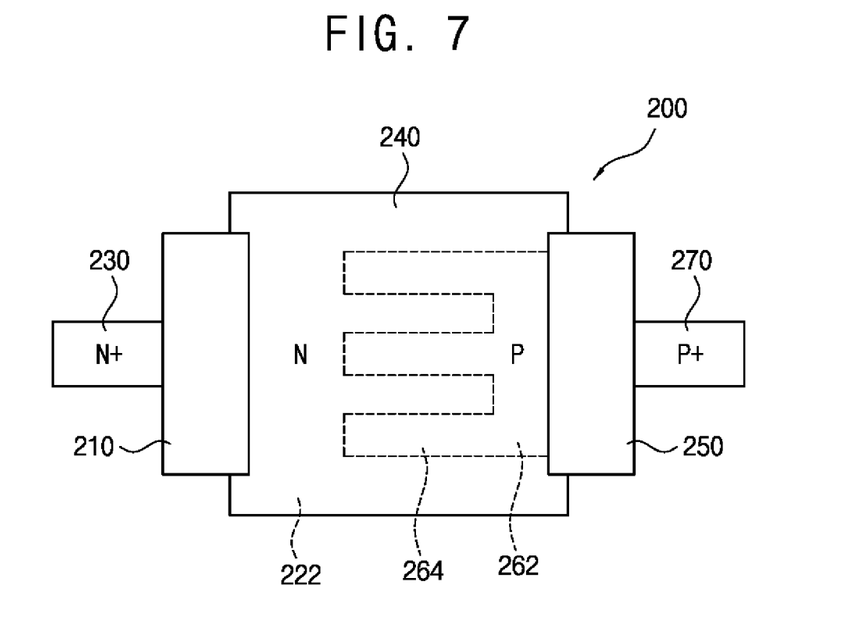
FIG. 7 is a plan view illustrating another example of the first and second charge storage regions as shown in FIG. 6.

FIG. 7 is a plan view illustrating another example of the first and second charge storage regions as shown in FIG. 6.

Referring to FIG. 7, a second charge storage region 262 may be disposed at least partially in a first charge storage region 222 and may be exposed through one side of the first charge storage region 222. Particularly, the second charge storage region 262 may have a plurality of extending portions 264 which extends to an inside of the first charge storage region 222.

For example, as shown in FIG. 7, the second charge storage region 262 may have a plurality of finger-shaped extending portions 264 disposed in the first charge storage region 222, and the geometric size of a p-n junction between the first and second charge storage regions 222 and 262 may thus be increased. Consequently, a photodiode region of the image sensor 200 may be fully depleted, and the incident photon-to-current conversion efficiency and the dynamic range of the image sensor 200 may be significantly improved.

FIGS. 8 to 11 are cross-sectional views illustrating a method of manufacturing an image sensor in accordance with still another exemplary embodiment of the present invention.

Figure 8:
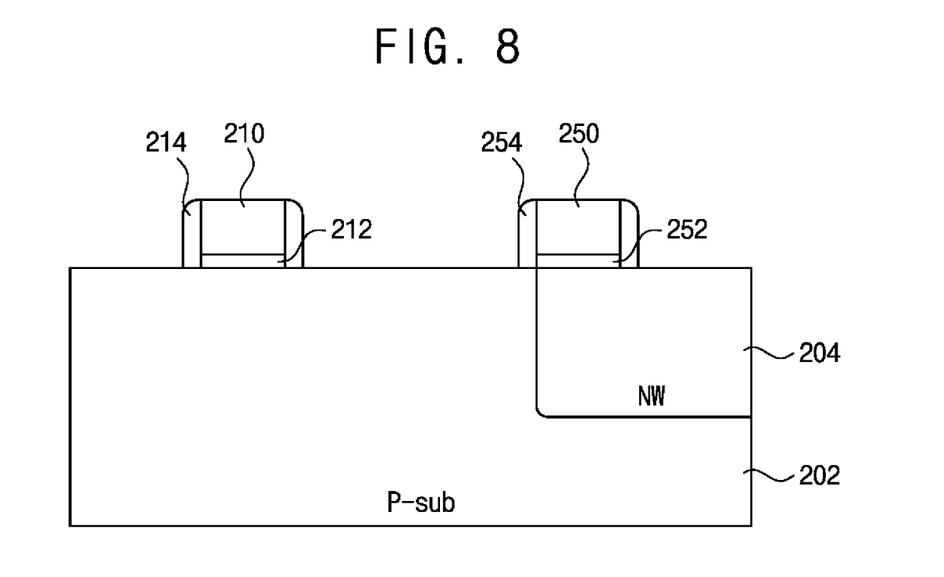
FIGS. 8 to 11 are cross-sectional views illustrating a method of manufacturing an image sensor in accordance with an embodiment.

Referring to FIG. 8, a first transfer gate 210 and a second transfer gate 250 may be formed on a substrate 202 to be spaced apart from each other. Further, a first gate insulating layer 212 may be formed between the first transfer gate 210 and the substrate 202, and first spacers 214 may be formed on side surfaces of the first transfer gate 210. A second gate insulating layer 252 may be formed between the second transfer gate 250 and the substrate 202, and second spacers 254 may be formed on side surfaces of the second transfer gate 250.

Before forming the first and second transfer gates 210 and 250, a first well region 204 of a first conductive type, for example, an n-type well (NW) region may be formed in the substrate 202 by an ion implantation process, and the second transfer gate 250 may be formed on the first well region 204. Alternatively, a second well region (106; See FIG. 4) of a second conductive type, for example, a p-type well (PW) region may be formed in the substrate 202 by an ion implantation process. In such case, the first transfer gate 210 may be formed on the second well region.

The substrate 202 may have the second conductive type. For example, a p-type substrate may be used as the substrate 202.

Figure 9:
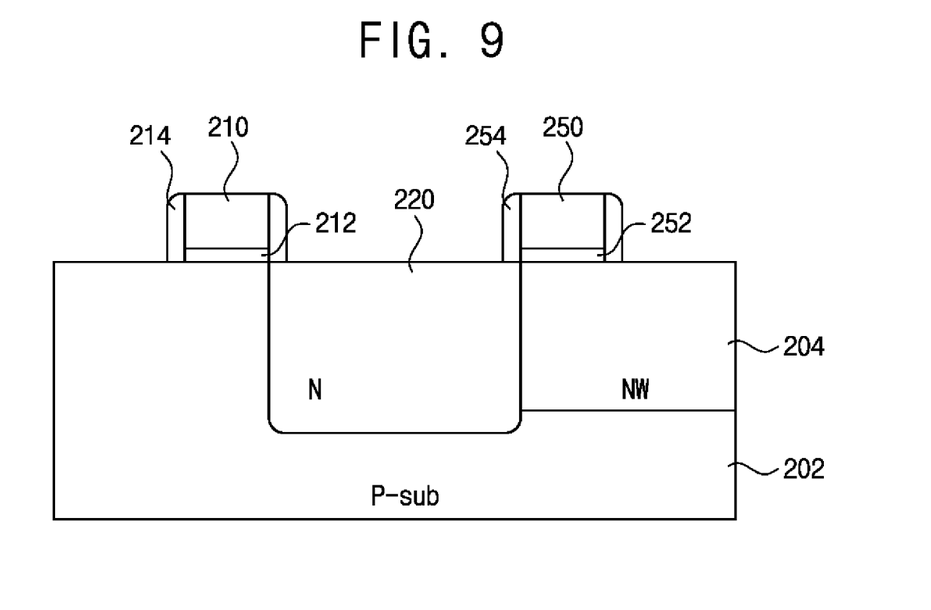

Referring to FIG. 9, a first charge storage region 220 of the first conductive type may be formed in the substrate 202 between the first and second transfer gates 210 and 250. For example, an n-type impurity region used as the first charge storage region 220 may be formed by ion implantation process.

Figure 10:
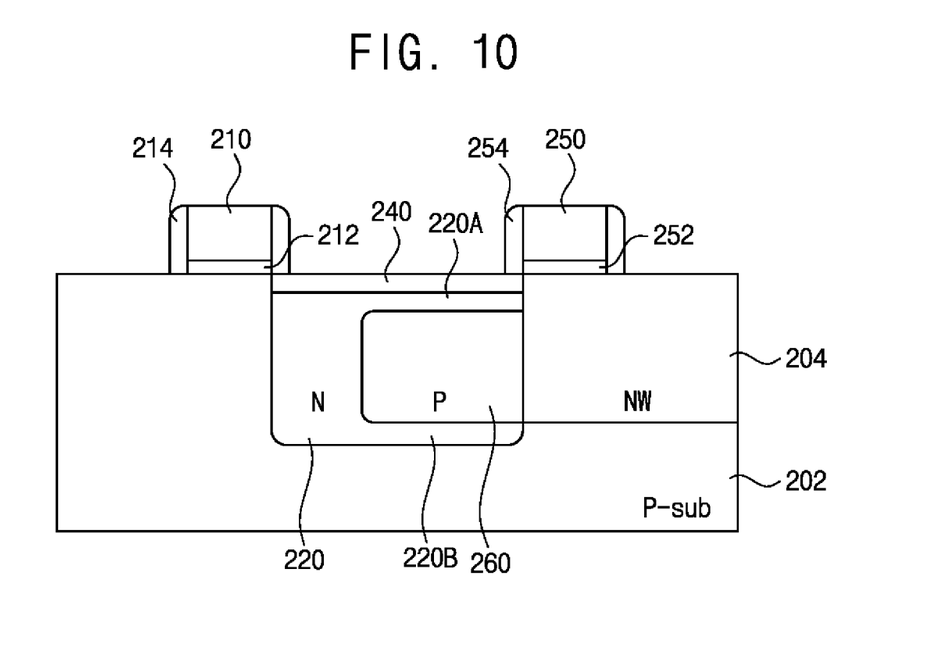

Referring to FIG. 10, a second charge storage region 260 of the second conductive type may be formed in the first charge storage region 220. For example, a p-type impurity region used as the second charge storage region 260 may be formed by ion implantation process to be adjacent to the second transfer gate 250. Particularly, the second charge storage region 260 may be laterally exposed through one side of the first charge storage region 220, and a p-n junction may thus be formed between the first well region 204 and the exposed one side of the second charge storage region 260 at their interface.

The second charge storage region 260 may extend to an inside of the first charge storage region 220 (See FIG. 6). Alternatively, the second charge storage region 260 may have a plurality of extending portions which extends to the inside of the first charge storage region 220 (See FIG. 7).

After forming the second charge storage region 260, a pinning layer 240 of the second conductive type may be formed on the first charge storage region 220 by an ion implantation process.

Alternatively, first and second charge storage regions 120 and 160 may be formed in the substrate 202 between the first and second transfer gates 210 and 250 to be bordered with each other (See FIG. 1). Further, a third charge storage region 122 may be formed under the first and second charge storage regions 120 and 160, and first and second pinning layers 140 and 142 may be formed on the first and second charge storage regions 120 and 160 (See FIG. 3).

The first charge storage region (120, 220) and/or the second charge storage region (160, 260) may be formed after the third charge storage region 122 is formed, in various combinations of the layers and structures described in the foregoing embodiments. The first and second pinning layers 140 and 142 may be sequentially formed on the first and second charge storage regions 120 and 160. Alternatively, the first charge storage region 120, the third charge storage region 122 and the first pinning layer 140 may be simultaneously formed, and then the second charge storage region 160 and the second pinning layer 142 may be sequentially formed.

Meanwhile, the second charge storage region 260 may be electrically isolated from the pinning layer 240 and the substrate 202 by an upper extending portion 220A and a lower extending portion 220B of the first charge storage region 220.

Figure 11:
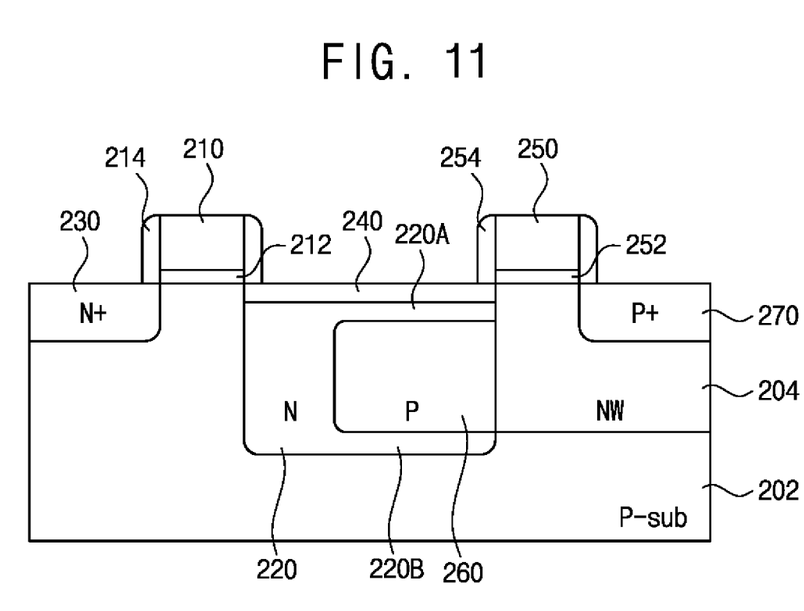

Referring to FIG. 11, a first floating diffusion region 230 may be formed in the substrate 202 to be adjacent to the first transfer gate 210, and a second floating diffusion region 270 may be formed in the substrate 202 to be adjacent to the second transfer gate 250. For example, a high concentration n-type impurity region may be formed by an ion implantation process to be used as the first floating diffusion region 230, and a high concentration p-type impurity region may be formed by an ion implantation process to be used as the second floating diffusion region 270.

In accordance with exemplary embodiments of the present invention as described above, a photodiode region of an image sensor may include a first charge storage region of a first conductive type and a second charge storage region of a second conductive type. First charge carriers, for example, electrons accumulated in the first charge storage region may be transferred to a first floating diffusion region, and second charge carriers, for example, holes accumulated in the second charge storage region may be transferred to a second floating diffusion region.

An output signal value of the image sensor may be determined by a difference value between a first output voltage from the first floating diffusion region and a second output voltage from the second floating diffusion region. Thus, the incident photon-to-current conversion efficiency of the image sensor may be significantly improved. Consequently, the sensitivity and the dynamic range of the image sensor may be significantly improved in comparison with the conventional art in which the sensitivity is determined by the incident photon-to-electron current conversion efficiency or the incident photon-to-hole current conversion efficiency.

Although the image sensor and the method of manufacturing the same have been described with reference to specific embodiments, they are not limited thereto. Therefore, it will be readily understood by those skilled in the art that various modifications and changes can be made thereto without departing from the spirit and scope of the present invention defined by the appended claims.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. §112(f) are not to be invoked unless the specific terms "means for" or "step for" are recited in a claim.

The invention claimed is:
1. An image sensor comprising:
 a first charge storage region of a first conductive type disposed in a substrate;
 a second charge storage region of a second conductive type disposed on one side of the first charge storage region;
 a first floating diffusion region spaced apart from the first charge storage region;
 a second floating diffusion region spaced apart from the second charge storage region;

a first transfer gate disposed on the substrate between the first charge storage region and the first floating diffusion region in a plan view;
a second transfer gate disposed on the substrate between the second charge storage region and the second floating diffusion region in the plan view;
a first pinning layer of the first conductive type disposed on the first and second charge storage regions; and
a second pinning layer of the second conductive type disposed on the first pinning layer, such that the first pinning layer electrically isolates the second charge storage region from the second pinning layer.

2. The image sensor of claim 1, further comprising a third charge storage region of the first conductive type disposed in the substrate,
wherein the first and second charge storage regions are disposed on the third charge storage region.

3. The image sensor of claim 1, further comprising a well region of the first conductive type disposed on one side of the second charge storage region,
wherein the second floating diffusion region and the second transfer gate are disposed on the well region.

4. The image sensor of claim 1, further comprising a well region of the second conductive type disposed on another side of the first charge storage region,
wherein the first floating diffusion region and the first transfer gate are disposed on the well region.

5. The image sensor of claim 1, wherein the second charge storage region has a plurality of extending portions which extends to an inside of the first charge storage region to increase a surface area of the interconnection of the first charge storage region and the second charge storage region.

6. An image sensor comprising:
a first charge storage region of a first conductive type disposed in a substrate;
a second charge storage region of a second conductive type disposed in the first charge storage region and laterally exposed through one side of the first charge storage region;
a first floating diffusion region spaced apart from the first charge storage region;
a second floating diffusion region spaced apart from the second charge storage region;
a first transfer gate disposed on the substrate between the first charge storage region and the first floating diffusion region in a plan view;
a second transfer gate disposed on the substrate between the second charge storage region and the second floating diffusion region in the plan view; and
a pinning layer of the second conductive type disposed on the first charge storage region.

7. The image sensor of claim 6, further comprising a well region of the first conductive type disposed on one side of the second charge storage region,
wherein the second floating diffusion region and the second transfer gate are disposed on the well region.

8. The image sensor of claim 6, further comprising a well region of the second conductive type disposed on another side of the first charge storage region,
wherein the first floating diffusion region and the first transfer gate are disposed on the well region.

9. A method of manufacturing an image sensor, the method comprising:
forming a first transfer gate and a second transfer gate spaced apart from each other on a substrate;
forming a first charge storage region of a first conductive type in the substrate between the first and second transfer gates;
forming a second charge storage region of a second conductive type, adjacent the first charge storage region;
forming a first floating diffusion region in the substrate, the first floating diffusion region being spaced apart from the first charge storage region, and the first transfer gate being disposed on the substrate between the first charge storage region and the first floating diffusion region in a plan view;
forming a second floating diffusion region in the substrate, the second floating diffusion region being spaced apart from the second charge storage region, and the second transfer gate being disposed on the substrate between the second charge storage region and the second floating diffusion region in the plan view;
forming a first pinning layer of the first conductive type disposed on the first and second charge storage regions; and
forming a second pinning layer of the second conductive type disposed on the first pinning layer, such that the first pinning layer electrically isolates the second charge storage region from the second pinning layer.

10. The method of claim 9, wherein the second charge storage region is arranged in the substrate between the first transfer gate and the second transfer gate, the second charge storage region being disposed on one side of the first charge storage region.

11. The method of claim 10, further comprising forming a third charge storage region of the first conductive type in the substrate,
wherein the first and second charge storage regions are formed on the third charge storage region.

12. The method of claim 10, further comprising:
forming a well region of the first conductive type in the substrate, wherein the second floating diffusion region and the second transfer gate are formed on the well region of the first conductive type; and
forming a well region of the second conductive type in the substrate, wherein the first floating diffusion region and the first transfer gate are formed on the well region of the second conductive type.

13. The method of claim 10, wherein the second charge storage region has a plurality of extending portions which extend to an inside of the first charge storage region to increase a surface area of the interconnection of the first charge storage region and the second charge storage region.

14. The method of claim 9, wherein the second charge storage region is arranged in the first charge storage region, and wherein the second charge storage region is laterally exposed through one side of the first charge storage region.

15. The method of claim 14, further comprising forming a pinning layer of the second conductive type on the first charge storage region.

* * * * *